United States Patent
Nomiya et al.

(10) Patent No.: US 7,569,162 B2
(45) Date of Patent: Aug. 4, 2009

(54) ELECTRICALLY CONDUCTIVE PASTE AND MULTILAYER CERAMIC SUBSTRATE

(75) Inventors: Masato Nomiya, Yasu (JP); Jun Urakawa, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 10/576,801

(22) PCT Filed: Nov. 10, 2004

(86) PCT No.: PCT/JP2004/016636

§ 371 (c)(1),
(2), (4) Date: Apr. 21, 2006

(87) PCT Pub. No.: WO2005/048667

PCT Pub. Date: May 26, 2005

(65) Prior Publication Data

US 2007/0080329 A1    Apr. 12, 2007

(30) Foreign Application Priority Data

Nov. 14, 2003 (JP) ............................. 2003-384739

(51) Int. Cl.
*H01B 1/02* (2006.01)
(52) U.S. Cl. .................. 252/512; 252/500; 428/209; 428/432
(58) Field of Classification Search .............. 252/500, 252/512; 428/209, 432; 174/262; 156/89; 29/852; 501/19
See application file for complete search history.

(56) References Cited

U.S. PATENT DOCUMENTS

| 4,400,214 | A | * | 8/1983 | Ogawa et al. ............... 106/1.13 |
| 4,594,181 | A | * | 6/1986 | Siuta ........................... 252/512 |
| 4,894,184 | A | * | 1/1990 | Fukuoka et al. ............. 252/512 |
| 5,298,330 | A | * | 3/1994 | Stadnicar, Jr. et al. ....... 428/432 |
| 5,337,475 | A | * | 8/1994 | Aoude et al. .................. 29/852 |
| 5,932,326 | A | * | 8/1999 | Kashima et al. ............. 428/209 |
| 6,348,426 | B1 | * | 2/2002 | Sanada et al. ................. 501/19 |

(Continued)

FOREIGN PATENT DOCUMENTS

CN    1411003 A    4/2003

(Continued)

OTHER PUBLICATIONS

Written Opinion of the International Searching Authority dated Feb. 22, 2005.

(Continued)

*Primary Examiner*—Mark Kopec
*Assistant Examiner*—Khanh Tuan Nguyen
(74) *Attorney, Agent, or Firm*—Dickstein Shapiro LLP

(57) ABSTRACT

An electrically conductive paste used for forming wiring conductors, such as via holes disposed on a multilayer ceramic substrate, is provided, wherein the temperature range in which sintering is effected in a firing step can be controlled relatively optimally. The electrically conductive paste contains a metal powder, a glass frit, and an organic vehicle. An inorganic component, which is not sintered at a sintering temperature capable of sintering the ceramic layers included in the multilayer ceramic substrate in the firing step, is disposed on particle surfaces of the metal powder. The glass frit has a softening point 150° C. to 300° C. lower than the above-described sintering temperature.

18 Claims, 2 Drawing Sheets

U.S. PATENT DOCUMENTS

| | | | |
|---|---|---|---|
| 6,762,369 B2 * | 7/2004 | Saito et al. | 174/262 |
| 6,815,046 B2 * | 11/2004 | Mandai et al. | 428/210 |
| 6,846,375 B2 * | 1/2005 | Hayama et al. | 156/89.16 |
| 2002/0157760 A1 * | 10/2002 | Mandai et al. | 156/89.12 |
| 2002/0187317 A1 * | 12/2002 | Tsuyuki et al. | 428/209 |
| 2003/0160219 A1 * | 8/2003 | Shimizu | 252/500 |
| 2004/0113128 A1 * | 6/2004 | Mears | 252/500 |
| 2004/0144962 A1 * | 7/2004 | Hayakawa et al. | 252/500 |
| 2006/0083906 A1 * | 4/2006 | Cho et al. | 428/209 |

FOREIGN PATENT DOCUMENTS

| | | | |
|---|---|---|---|
| JP | 62-022868 | * | 1/1987 |
| JP | 05-217421 | | 8/1993 |
| JP | 06-203626 | * | 7/1994 |
| JP | 09-295883 | | 11/1997 |
| JP | 10-095686 | | 4/1998 |
| JP | 10-215046 | | 8/1998 |
| JP | 10-283840 | * | 10/1998 |
| JP | 2002-198626 | | 7/2002 |
| JP | 2003-179320 | | 6/2003 |

OTHER PUBLICATIONS

Chemical Handbook, Date Unknown.

Physicochemical Dictionary, Date Unknown.

* cited by examiner

ELECTRICALLY CONDUCTIVE PASTE AND MULTILAYER CERAMIC SUBSTRATE

TECHNICAL FIELD

The present invention relates to an electrically conductive paste used for forming wiring conductors disposed in a multilayer ceramic substrate, as well as the multilayer ceramic substrate. In particular, it relates to an electrically conductive paste to be co-fired in a firing step for sintering ceramic layers in the manufacture of a multilayer ceramic substrate, as well as the multilayer ceramic substrate provided with the wiring conductors formed by using the electrically conductive paste.

BACKGROUND ART

An electrically conductive paste contains at least a metal powder and an organic vehicle. The electrically conductive paste has been widely used in the field of electronic components, since a conductor with a desired pattern or in a desired form can easily be formed by applying printing or the like to the electrically conductive paste. More specifically, the electrically conductive paste has been widely used for forming wiring conductors, such as conductor films and via hole conductors disposed in multilayer ceramic substrates.

As described above, the electrically conductive paste used for forming wiring conductors disposed on the multilayer ceramic substrate, in particular, the electrically conductive paste used for forming internal conductor films and via hole conductors located in the inside of the multilayer ceramic substrate, is co-fired in the firing step of sintering ceramic layers disposed in the multilayer ceramic substrate when the multilayer ceramic substrate is manufactured. In this case, with respect to the shrinkage behavior during the firing, it is desirable that the shrinkage behavior on the ceramic layer side and the shrinkage behavior on the wiring conductor side are matched with each other as much as possible.

However, in general, since the electrically conductive paste for forming the wiring conductor starts shrinking in a temperature range lower than the sintering temperature capable of sintering the ceramic layer, a difference in shrinkage behavior occurs between the ceramic layer and the wiring conductor. Consequently, a stress resulting from this difference in shrinkage behavior may cause an occurrence of structural defect, e.g., crack or delamination, in a produced multilayer ceramic substrate.

In order to overcome the above-described problems, for example, each of Japanese Unexamined Patent Application Publication No. 10-95686 (Patent Document 1), Japanese Unexamined Patent Application Publication No. 9-295883 (Patent Document 2), and Japanese Unexamined Patent Application Publication No. 5-217421 (Patent Document 3) describes that the composition of an electrically conductive paste is improved and, thereby, an occurrence of sintering of the electrically conductive paste is suppressed.

Patent Document 1 describes an electrically conductive paste which is co-fired with a glass ceramic substrate and in which a specific metal oxide or a specific metal is added as a sintering inhibitor to Cu, $Cu_2O$, a Cu—$Cu_2O$ mixture, or a Cu—CuO mixture serving as an electrically conductive component.

Patent Document 2 describes an electrically conductive paste which is co-fired with a glass ceramic substrate and which contains an electrically conductive component primarily containing copper. This electrically conductive paste contains an oxide of at least one of an alkali metal, an alkaline-earth metal, and boron as a metal oxide to decrease the viscosity of a glass component in the glass ceramic substrate and an inorganic material to retard sintering of copper.

Patent Document 3 describes an electrically conductive paste containing a copper powder and a glass powder.

However, the electrically conductive paste in each of the above-described Patent Documents 1 to 3 has the following problems to be overcome.

The electrically conductive paste described in Patent Document 1 contains the specific metal oxide or the specific metal in a state of a powder as the sintering inhibitor of the electrically conductive components. Such a sintering inhibitor cannot completely suppress the solid phase mutual sintering of electrically conductive component. Therefore, in order to satisfactorily suppress the sintering, addition of correspondingly large amounts of sintering inhibitor is required. Furthermore, since the sintering of the electrically conductive paste depends on glass diffusing from the glass ceramic substrate, unsintered regions may be left in the conductor in the case where the size of the conductor to be formed from the electrically conductive paste is large as compared with the diffusion distance of the glass or in the case where the amount of glass component diffusing from the glass ceramic substrate is not adequate.

The electrically conductive paste described in Patent Document 2 contains the oxide of at least one of an alkali metal, an alkaline-earth metal, and boron to facilitate diffusion of the glass component in the glass ceramic substrate. However, the electrically conductive paste described in Patent Document 2 cannot completely suppress the mutual sintering of the electrically conductive component as in the case of the electrically conductive paste described in Patent Document 1. Therefore, the shrinkage behavior thereof varies depending on the amount of addition of the inorganic material serving as a sintering-suppressing component or a dispersion state. Although the diffusion distance of the glass component in the glass ceramic substrate becomes longer by addition of an alkali metal or the like, the start point of the glass diffusion is essentially the interface between the conductor and the glass ceramic substrate, and the metal oxide to decrease the viscosity of the glass contributes to only the diffusion of glass from this interface. Consequently, in the case where the size of the conductor is large or in the case where the amount of glass component diffusible from the glass ceramic substrate is small, the effect is reduced and unsintered regions may be left.

The electrically conductive paste described in Patent Document 3 contains the glass powder. However, as in the case of the electrically conductive paste in the above-described Patent Documents 1 and 2, this cannot completely suppress the sintering of copper. Furthermore, in the case where the softening point of the glass component constituting the glass powder is at least 300° C. lower than the firing temperature applied to the firing step for producing the ceramic substrate, the sintering behavior of the electrically conductive paste is not varied and, in addition, sintering of the ceramic substrate occurs at a temperature lower than a predetermined sintering temperature by diffusion of softened glass into an unsintered ceramic substrate and a plurality of regions having mutually different sintering temperatures are formed in the ceramic substrate, so that this may cause an occurrence of cracking and the like. Since the surface of the copper powder exhibits inherently poor wettability with general glass, the softened glass is pushed out to the grain boundary portion during the mutual sintering of the copper powder. As a result, large amounts of glass component may seep to the surface of the conductor. The thus seeping glass component exerts an adverse effect when a surface treatment, such as plating, is conducted, for example.

On the other hand, the method in which a so-called non-shrinkage process is applied has been noted as a method for manufacturing a multilayer ceramic substrate. This can respond to requirements for miniaturization, higher function, higher precision, higher density, and the like of the multilayer ceramic substrate. Consequently, distortion and variations in shrinkage due to sintering in the firing step conducted in the manufacture of the multilayer ceramic substrate are suppressed, and different types of materials can be incorporated into the multilayer ceramic substrate.

Some types are included in the non-shrinkage processes. For example, there is a process, in which a constraint layer containing inorganic material powder having a sintering start temperature or a sintering finish temperature different from that of substrate ceramic green sheets to become a plurality of ceramic layers included in the multilayer ceramic substrate is disposed along each of the substrate ceramic green sheets, the shrinkage suppression effect of the constraint layer is allowed to be exerted on the substrate ceramic green sheet, that is, the ceramic layer, in the firing step, and thereby, the non-shrinkage process is achieved. This may be referred to as an interlayer constraint method, and is particularly effective at suppressing the distortion in the thickness direction of the multilayer ceramic substrate and suppressing the distortion at a cavity portion in the case where the cavity is formed in the multilayer ceramic substrate.

In addition, the non-shrinkage processes also include a method, in which constraint layers that do not shrink during the firing are disposed along both main surfaces of a green multilayer ceramic substrate and, thereby, shrinkage of the multilayer ceramic substrate in the firing step is suppressed. In this method, a porous ceramic layer that is not sintered at the firing temperature of the multilayer ceramic substrate or a conductor film, e.g., metal foil, is used as the constraint layer. If necessary, the constraint layers are removed after the firing step.

When the multilayer ceramic substrate provided with via hole conductors disposed penetrating specific ceramic layers is manufactured, the electrically conductive paste for forming the via hole conductors is co-fired in the firing step to sinter the ceramic layers, as described above.

When the above-described non-shrinkage process is applied to the above-described manufacture of the multilayer ceramic substrate, in the firing step, the ceramic layer exhibits the shrinkage behavior substantially only in the thickness direction since the shrinkage in the main surface direction is suppressed. The degree of the shrinkage in the thickness direction is larger than the degree of shrinkage in the case where the non-shrinkage process is not applied. On the other hand, the electrically conductive paste for the via hole conductors exhibits the shrinkage behavior isotropically. As a result, inconveniences shown in FIG. 4 may occur.

FIG. 4 is a magnified sectional view of a part of the multilayer ceramic substrate 1 after the firing. This multilayer ceramic substrate 1 is an example of those manufactured by applying the non-shrinkage process through the use of the above-described interlayer constraint method, and a constraint layer 3 is disposed along each of a plurality of ceramic layers 2. A via hole conductor 4 is disposed penetrating specific ceramic layers 2.

As described above, in the firing step, the ceramic layers 2 exhibit the shrinkage behavior substantially only in the thickness direction, whereas the via hole conductor 4 exhibits the shrinkage behavior isotropically. Consequently, the ceramic layers 2 are peeled from the via hole conductor 4 at the outer perimeter portion of the via hole conductor 4, and gaps 5 may occur there. The end portion of the via hole conductor 4 may protuberate from the main surface 6 of the multilayer ceramic substrate 1, and a relatively large protuberance 7 may be formed around the via hole conductor 4.

Usually, the electrically conductive paste to become the via hole conductor 4 starts shrinking in a temperature range lower than the shrinkage start temperature of the ceramic layer 2 due to sintering. Consequently, the shrinkage behaviors of the ceramic layer 2 and the via hole conductor 4 do not match with each other. This also causes the occurrence of the above-described gap 5 and, in addition, this causes the occurrence of structural defect, e.g., crack or delamination, in the multilayer ceramic substrate 1.

It is believed that inconveniences encountered in the method for manufacturing a multilayer ceramic substrate through the use of the above-described non-shrinkage process can be overcome to some extent by realizing a technology capable of optimally controlling the shrinkage behavior during firing of the electrically conductive paste used for forming the via hole conductor 4. In this regard, the above-described inconveniences are not satisfactorily overcome by the technology disclosed in each of the above-described Patent Documents 1 to 3.

Patent Document 1: Japanese Unexamined Patent Application Publication No. 10-95686

Patent Document 2: Japanese Unexamined Patent Application Publication No. 9-295883

Patent Document 3: Japanese Unexamined Patent Application Publication No. 5-217421

DISCLOSURE OF INVENTION

Problems to be Solved by the Invention

Accordingly, the object of the present invention is to provide an electrically conductive paste used for forming wiring conductors disposed on a multilayer ceramic substrate, wherein the temperature range in which sintering is effected in a firing step can be controlled relatively optimally.

It is also an object of the present invention to provide a multilayer ceramic substrate including wiring conductors formed by using the above-described electrically conductive paste.

Means for Solving the Problems

An aspect of the present invention is directed to an electrically conductive paste which is used for forming wiring conductors and which is co-fired in a firing step for sintering ceramic layers, in a multilayer ceramic substrate provided with a plurality of ceramic layers laminated and wiring conductors disposed in association with the ceramic layers, and has a feature that the following configuration is provided.

The electrically conductive paste according to an aspect of the present invention is characterized by including a metal powder, a glass frit, and an organic vehicle, wherein an inorganic component, which is not sintered at a sintering temperature capable of sintering the ceramic layer in the firing step, is disposed on particle surfaces of the metal powder, and the glass frit has a softening point 150° C. to 300° C. lower than the above-described sintering temperature.

When the above-described sintering temperature is 800° C. to 1,000° C. with respect to the electrically conductive paste according to the above-described aspect of the present invention, preferably, the softening point of the glass frit is 650° C. to 850° C.

With respect to the electrically conductive paste according to the above-described aspect of the present invention, preferably, a temperature at which $\log(\eta/\text{Pa}\cdot\text{s})=4$ holds for the viscosity of the glass frit is present within the range of 800° C. to 950° C.

With respect to the electrically conductive paste according to the above-described aspect of the present invention, preferably, the content of the above-described inorganic component is 0.5 to 8 percent by weight relative to the total weight of the metal powder and the inorganic component.

Another aspect of the present invention is directed to a multilayer ceramic substrate including a plurality of ceramic layers laminated and wiring conductors disposed in association with the ceramic layers. The multilayer ceramic substrate according to this aspect is characterized in that the above-described wiring conductors are composed of sintered bodies of the electrically conductive paste according to the above-described aspect of the present invention.

In the above-described multilayer ceramic substrate, the electrically conductive paste according to the above-described aspect of the present invention has a particular advantage in its suitability for forming via hole conductors disposed penetrating specific ceramic layers.

Advantages

Since the inorganic component, which is not sintered at the sintering temperature capable of sintering the ceramic layer, is disposed on particle surfaces of the metal powder, in the firing step for manufacturing the multilayer ceramic substrate in which the wiring conductors are formed by using the electrically conductive paste according to an aspect of the present invention, the metal powder becomes difficult to exhibit the sintering behavior in the firing step.

On the other hand, since the electrically conductive paste according to an aspect of the present invention includes the glass frit having a softening point 150° C. to 300° C. lower than the above-described sintering temperature, the liquid phase sintering of the glass and the inorganic component is started at the point in time when the glass constituting the glass frit is softened in the above-described firing step, and the inorganic component disposed on the particle surfaces of the metal powder is removed. Consequently, the metal powder can be sintered.

The sintering behavior of the metal powder at this time varies depending on the interaction between the inorganic component and the glass frit, more specifically, depending on the tendency of softening of the glass and the amount of the inorganic component. Therefore, the sintering start temperature of the metal powder can be controlled by controlling the tendency of softening of the glass and the amount of the inorganic component. As a result, the sintering behavior of the metal powder can be controlled to become close to the sintering behavior of the ceramic layer. Consequently, for example, an occurrence of relatively large protuberance around the via hole conductor or an occurrence of structural defect, e.g., crack or delamination, in the multilayer ceramic substrate can be suppressed.

When the temperature capable of sintering the ceramic layers is 800° C. to 1,000° C., the width of selection of the inorganic component disposed on the particle surfaces of the metal powder can be increased. In addition, in the case where the non-shrinkage process is applied, the width of selection of the material constituting the constraint layer can be increased. In this case, the effect of the present invention can be exerted more reliably by selecting the softening point of the glass frit within the range of 650° C. to 850° C.

When the condition that a temperature at which $\log(\eta/\text{Pa}\cdot\text{s})=4$ holds for the viscosity of the glass frit is present within the range of 800° C. to 950° C. is satisfied, the effect of the present invention can be exerted more reliably.

Preferably, the content of the inorganic component disposed on the surfaces of the metal powder in the electrically conductive paste according to an aspect of the present invention is 0.5 to 8 percent by weight relative to the total weight of the metal powder and the inorganic component, as described above, and 1 to 7 percent by weight is more preferable. The above-described content of the inorganic component also depends on the state of adhesion of the inorganic component to the surfaces of the metal powder or the surface area of the metal powder. The metal powder having a small average particle diameter, for example, an average particle diameter of 0.5 μm or less, has a relatively large specific surface area and, therefore, the sintering suppression effect becomes inadequate when the content of the inorganic component is less than 0.5 percent by weight. On the other hand, the metal powder having a large average particle diameter, for example, an average particle diameter of 10 μm or more, has a relatively small specific surface area and, therefore, when the content of the inorganic component exceeds 8 percent by weight, the thickness of the film consisting of the inorganic component becomes excessive and the sintering start effect of the glass frit is not exerted. The excessive presence of the inorganic component may lead to reduction in the electrical conductivity and, therefore, it is not preferable.

BRIEF DESCRIPTION OF THE DRAWINGS

FIG. 1 is a sectional view for illustrating a multilayer ceramic substrate 11 provided with wiring conductors by using an electrically conductive paste according to an embodiment of the present invention.

FIG. 2 is a sectional view showing a magnified portion 16 provided with a via hole conductor 15, in the multilayer ceramic substrate 11 shown in FIG. 1.

FIG. 3 is a diagram showing softening curves of four types of glass A to glass D used as the glass constituting the glass frits contained in electrically conductive pastes, in examples of experiments conducted to ascertain the effects of the present invention.

FIG. 4 is a diagram for explaining problems to be solved by the present invention, and is a sectional view of a magnified part of the multilayer ceramic substrate 1.

Figure 1:
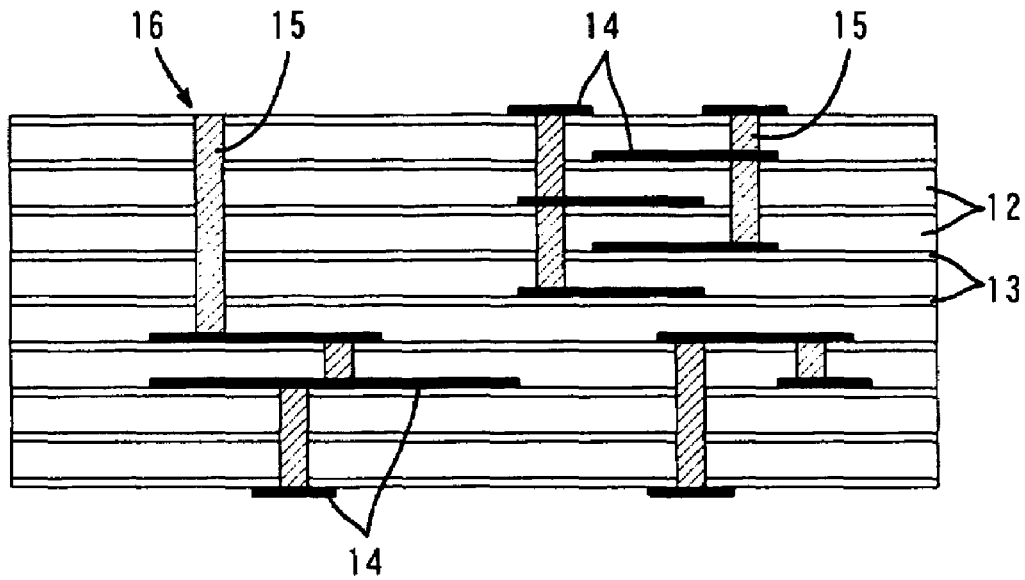
[FIG. 1]

REFERENCE NUMERALS 11 multilayer ceramic substrate
12 ceramic layer
14 conductor film
15 via hole conductor

BEST MODE FOR CARRYING OUT THE INVENTION

FIG. 1 is a sectional view for illustrating a multilayer ceramic substrate 11 provided with wiring conductors by using an electrically conductive paste according to an embodiment of the present invention.

The multilayer ceramic substrate 11 is provided with a plurality of ceramic layers 12 laminated. The multilayer ceramic substrate 11 is manufactured by application of the non-shrinkage process through the use of the above-described interlayer constraint method and, therefore, a constraint layer 13 is disposed along each of the plurality of ceramic layers 12.

Furthermore, the multilayer ceramic substrate 11 is provided with wiring conductors disposed in association with the ceramic layers 12. The wiring conductors include some conductor films 14 disposed on the ceramic layers 12 or the constraint layers 13 and some via hole conductors 15 disposed penetrating specific ceramic layers 12.

In order to manufacture the above-described multilayer ceramic substrate 11, for example, the following process is conducted.

Substrate ceramic green sheets to become ceramic layers 12 are prepared. The substrate ceramic green sheet is allowed to have a material composition sinterable at a temperature of, for example, 800° C. to 1,000° C. As an example, an organic binder, an organic solvent, and the like are added to a ceramic material powder containing each powder of barium oxide, silicon oxide, alumina, boron oxide and/or calcium oxide as primary components, the resulting slurry is molded into the shape of a sheet and, thereby, the substrate ceramic green sheet is produced.

In the case where a reducing atmosphere is required in the firing step due to the characteristics of materials constituting the electrically conductive paste described below, the ceramic material powder contained in the substrate ceramic green sheet must be selected from those which are not reduced even by firing in the reducing atmosphere.

The constraint layer 13 is formed on the above-described substrate ceramic green sheet. An organic binder, an organic solvent, and the like are added to an inorganic material powder, which is substantially not sintered at the sintering temperature capable of sintering the ceramic material powder contained in the substrate ceramic green sheet, followed by mixing them, so as to produce a slurry. The resulting slurry is applied to the substrate ceramic green sheet by printing or the like to have the shape of a thin film and, thereby, the constraint layer 13 is formed.

As described above, in the case where the ceramic material powder contained in the substrate ceramic green sheet can be sintered at a temperature of 1,000° C. or lower, an alumina powder, a zirconia powder, or the like can be used as a primary component of the inorganic material powder contained in the constraint layer 13 and, if necessary, a glass component serving as a sintering promoter may be added.

As shown in FIG. 1, the constraint layer 13 is not necessarily formed on every substrate ceramic green sheet to become the ceramic layer 12.

On the other hand, the electrically conductive paste for forming the conductor films 14 and the via hole conductors 15 is prepared. The electrically conductive paste contains a metal powder, a glass frit, and an organic vehicle.

Preferably, the metal constituting the metal powder contained in the electrically conductive paste primarily contains a metal, e.g., Ag, Au, Cu, Ni, a Ag—Pd alloy, or a Ag—Pt alloy, having excellent electrical conductivity. Other metal powders or metal oxide powders may be added within the bounds of not turning the ranking of the amount of addition as long as the powder does not react unnecessarily with the ceramic layers 12 or the powder does not melt or the like during firing in the firing step of sintering the ceramic layers 12. The particle shape, the average particle diameter, and the particle size distribution of the metal powder are not specifically limited. However, preferably, the average particle diameter is about 0.5 to 10 μm, and no coarse powder nor extremely agglomerated powder is included.

In the present invention, an inorganic component, which is not sintered at a sintering temperature capable of sintering the ceramic layer 12 in the firing step, is disposed on particle surfaces of a metal powder, and the resulting metal powder is used as the above-described metal powder. For example, an oxide containing at least one of Al, Si, Zr, Ni, Ti, Nb, Mn, and Mg can be used as this inorganic component. The above-described inorganic component must be selected from the viewpoint of the shrinkage condition of the ceramic layer 12 in the firing step, the affinity for the glass frit, and the like as well. In particular, it is preferable that an oxide containing Al, Si, or Zr is used.

Although the content of the above-described inorganic component, more specifically, the amount of coating of the inorganic component on the metal powder particle surfaces depends on the state of adhesion of the inorganic component to the metal powder particle surfaces or the surface area of the metal powder. For example, for the above-described metal powder having an average particle diameter of about 0.5 to 10 μm, it is preferable that the amount of coating is 0.5 to 8 percent by weight relative to the total weight of the metal powder and the inorganic component, and 1 to 7 percent by weight is more preferable.

If the amount of coating is less than 0.5 percent by weight, since the metal powder having a small average particle diameter of 0.5 μm or less has a relatively large specific surface area, the sintering suppression effect of the inorganic component becomes inadequate. On the other hand, if the amount of coating exceeds 8 percent by weight, since the metal powder having a relatively large average particle diameter of, for example, 10 μm or more has a relatively small specific surface area, the thickness of the coating film consisting of the inorganic component becomes excessive and the glass frit becomes difficult to exert the sintering start effect. Furthermore, the presence of the coating film having an excessive thickness leads to reduction in the electrical conductivity.

For example, the following method can be adopted as the method for disposing the inorganic component on the particle surfaces of the metal powder.

The case where the inorganic component is alumina will be described. For example, a method in which a metal powder is coated with an organic aluminate, e.g., an alkyl aluminate, and thereafter, a heat treatment is conducted, a method in which a metal powder is immersed in an aluminum salt solution and, thereafter, drying and a heat treatment are conducted, a method in which a fine alumina powder is treated by a microcapsule method, or the like can be applied.

The glass frit contained in the electrically conductive paste has a softening point 150° C. to 300° C. lower than the sintering temperature capable of sintering the ceramic layer 12. For example, when the sintering temperature is 800° C. to 1,000° C., preferably, the softening point of the glass frit is 650° C. to 850° C. The above-described softening point of the glass frit is defined as a temperature at which $\log(\eta/Pa \cdot s) = 6.65$ holds.

If the softening point of the glass frit is lower than the sintering temperature of the ceramic layer 12 with the temperature difference exceeding 300° C., sintering of the electrically conductive paste is started at a relatively early stage in the firing step. Consequently, undesirably, the shrinkage behaviors of the electrically conductive paste and the ceramic layer 12 cannot be matched with each other. On the other hand, if the temperature difference between the softening point of the glass frit and the sintering temperature is only less than 150° C., the glass frit is not adequately softened. As a result, the diffusion of the glass component in the electrically conductive paste becomes inadequate, and undesirably, unsintered portions may be left in the wiring conductors.

Preferably, a temperature at which $\log(\eta/Pa\cdot s)=4$ holds for the viscosity of the glass frit is present within the range of 800° C. to 950° C.

Preferably, Si—B based glass is used as the glass constituting the above-described glass frit. More preferably, a mixture containing 40 to 55 percent by weight of $SiO_2$, 10 to 20 percent by weight of $B_2O_3$, and 20 to 30 percent by weight of BaO and/or SrO is melted at a predetermined temperature and, thereafter, the resulting mixture is vitrified and used. The glass having a known composition can be used as the glass frit as long as the glass does not excessively react with the ceramic layer 12.

Preferably, the particle diameter of the glass frit is selected in accordance with the particle diameter of the metal powder. However, the average particle diameter of about 0.5 to 3 μm is preferable since excellent dispersibility can be exerted. It is desirable that no coarse powder nor extremely agglomerated powder is included.

The organic vehicle contained in the electrically conductive paste is a mixture of a binder resin and an organic solvent. Although not specifically limited, for example, alcohols, e.g., terpineol, isopropyl alcohol, butyl carbitol, and butyl carbitol acetate, can be used as the organic solvent. On the other hand, for example, an acrylic resin, an alkyd resin, a butyral resin, ethyl cellulose, and the like can be used as the binder resin. If necessary, a dispersing agent, a plasticizer, an activator, and the like may be added to the organic vehicle.

Furthermore, a resin powder or a copper oxide powder that is not dissolved into the organic solvent in the organic vehicle may be contained in the electrically conductive paste. The resin powder and the copper oxide powder have the function of relaxing the stress generated in the firing step. Preferably, the average particle diameters of the resin powder and the copper oxide powder are about 3 to 7 μm, and no coarse powder nor extremely agglomerated powder is included. For example, a powder consisting of a polypropylene, a polyethylene, a polystyrene, an acrylic resin, a cellulose resin, or the like can be used as the resin powder.

Preferably, the content of each of the above-described components in the electrically conductive paste is selected in such a way that, for example, the metal powder provided with the inorganic component on the surface constitutes 60 to 85 percent by weight, the glass frit constitutes 1 to 10 percent by weight, the copper oxide powder constitutes 0 to 40 percent by weight, the organic vehicle constitutes 10 to 25 percent by weight, and the resin powder that is not dissolved into the solvent in the organic vehicle constitutes 0 to 7 percent by weight.

The preferable content of the glass frit is specified to be 1 to 10 percent by weight, as described above, for the following reasons. If the content of the glass frit exceeds 10 percent by weight, the continuity resistance of the wiring conductor formed from the electrically conductive paste is increased, the glass tends to seep to the surface of the wiring conductor, and undesirably, deposition of plating is hindered, for example. On the other hand, although the lower limit of the content of the glass frit depends on the amount of the resin component that is not dissolved into the solvent component in the organic vehicle and the tendency of softening of the glass frit, even when the former resin component is added at the maximum and, as a result, the content of the metal powder is small, if the content of the glass frit is less than 1 percent by weight, the amount adequate for removing the inorganic component on the particle surfaces of the metal powder is not reached. Consequently, unsintered portions may be left on the wiring conductors.

In the production of the electrically conductive paste, the above-described individual components are agitated and kneaded with, for example, an agitating and triturating machine, a triple roller mill, or the like.

Through holes for providing the via hole conductors 15 are formed in specific sheets of the above-described substrate ceramic green sheets. In this case, when the constraint layer 13 is disposed on the substrate ceramic green sheet, the through hole is formed while penetrating the constraint layer 13 as well.

The above-described electrically conductive paste is filled in the through holes and, thereby, unfired via hole conductors 15 are formed. Furthermore, the electrically conductive paste is applied to the substrate ceramic green sheets or the constraint layers 13 by a screen printing method, a transfer method, or the like and, thereby, unfired conductor films 14 are formed. The electrically conductive paste according to the present invention can be used for either of the conductor film 14 and the via hole conductor 15. However, use for the via hole conductor 15, to which the constraint force of the constraint layer 13 is difficult to extend, is particularly preferable.

The above-described substrate ceramic green sheets are laminated together with the constraint layers 13 and are press-bonded so as to produce a green multilayer ceramic substrate 11 shown in FIG. 1.

The firing step is conducted. Consequently, the ceramic layers 12 are sintered and, in addition, the electrically conductive paste is co-fired, so that the conductor films 14 and the via hole conductors 15, each composed of the sintered body of the electrically conductive paste, are formed.

In the above-described firing step, since the constraint layer 13 is not sintered substantially, the constraint layer 13 do not shrink substantially. Consequently, the shrinkage suppression effect of the constraint layer 13 is exerted on the ceramic layer 12, and the ceramic layer 12 shrinks substantially in the thickness direction only, while the shrinkage in a direction parallel to the main surface thereof is suppressed.

The above-described constraint layer 13 is densified and solidified through infiltration of the material contained in the ceramic layer 12 at the point in time when the firing step is finished, and is left in the multilayer ceramic substrate 11 which is a product.

As described above, the multilayer ceramic substrate 11 shown in FIG. 1 is produced.

Figure 2:
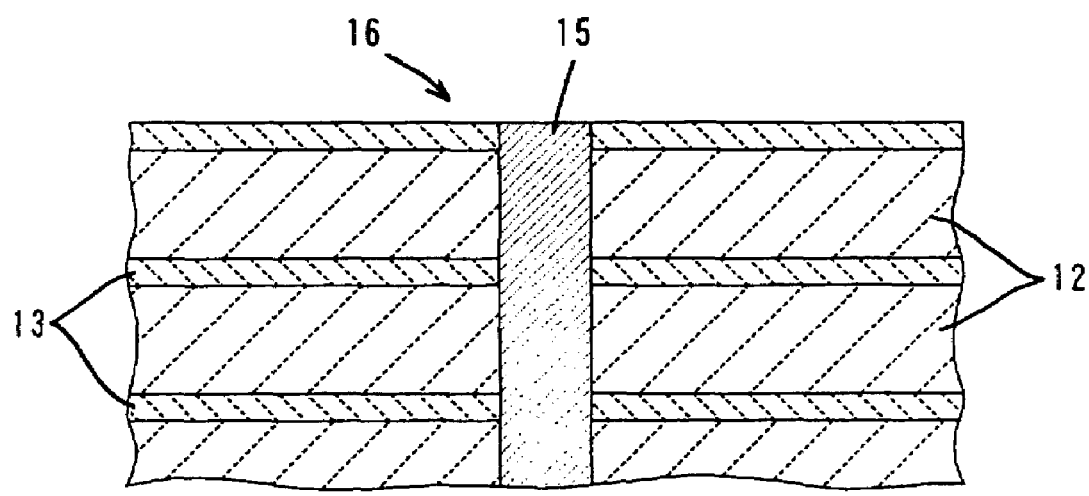
[FIG. 2]
Figure 4:
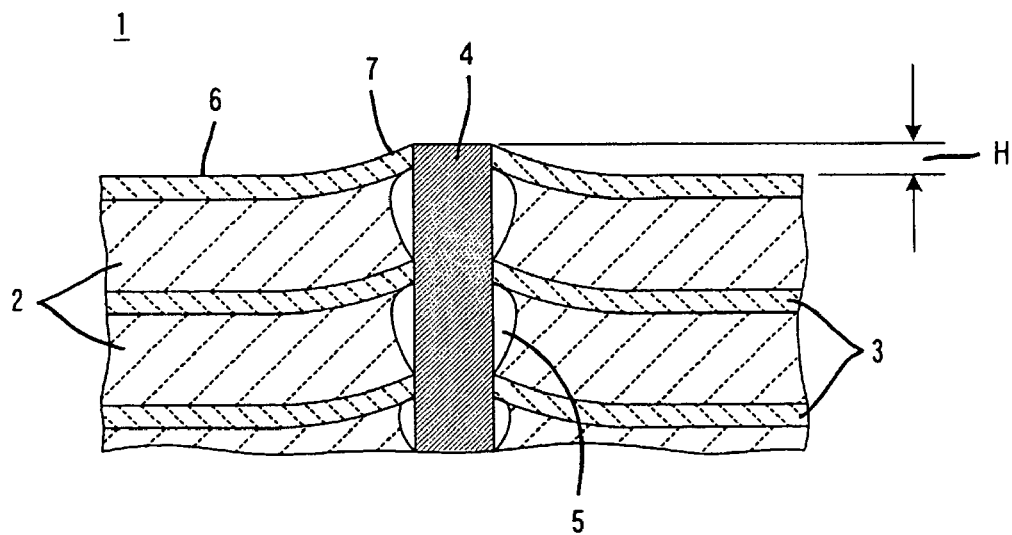
[FIG. 4]

FIG. 2 is a sectional view showing a magnified portion 16 provided with a via hole conductor 15, in the multilayer ceramic substrate 11 shown in FIG. 1. FIG. 2 is a diagram corresponding to the above-described FIG. 4 as well.

When the electrically conductive paste according to the present invention is used for forming the via hole conductor 15, the shrinkage behavior thereof during the firing step is allowed to become close to the shrinkage behavior of the ceramic layer 12 side. Consequently, an occurrence of gap at the outer perimeter portion of the via hole conductor 15, as shown in FIG. 2, can be prevented, and an occurrence of large protuberance of end portion of the via hole conductor 15 can be prevented. Furthermore, a structural defect, e.g., crack or delamination, in the multilayer ceramic substrate 11 can be made resistant to occurring.

The examples of experiments conducted to ascertain the effects of the electrically conductive paste according to the present invention will be described below.

1. Glass Frit

Figure 3:
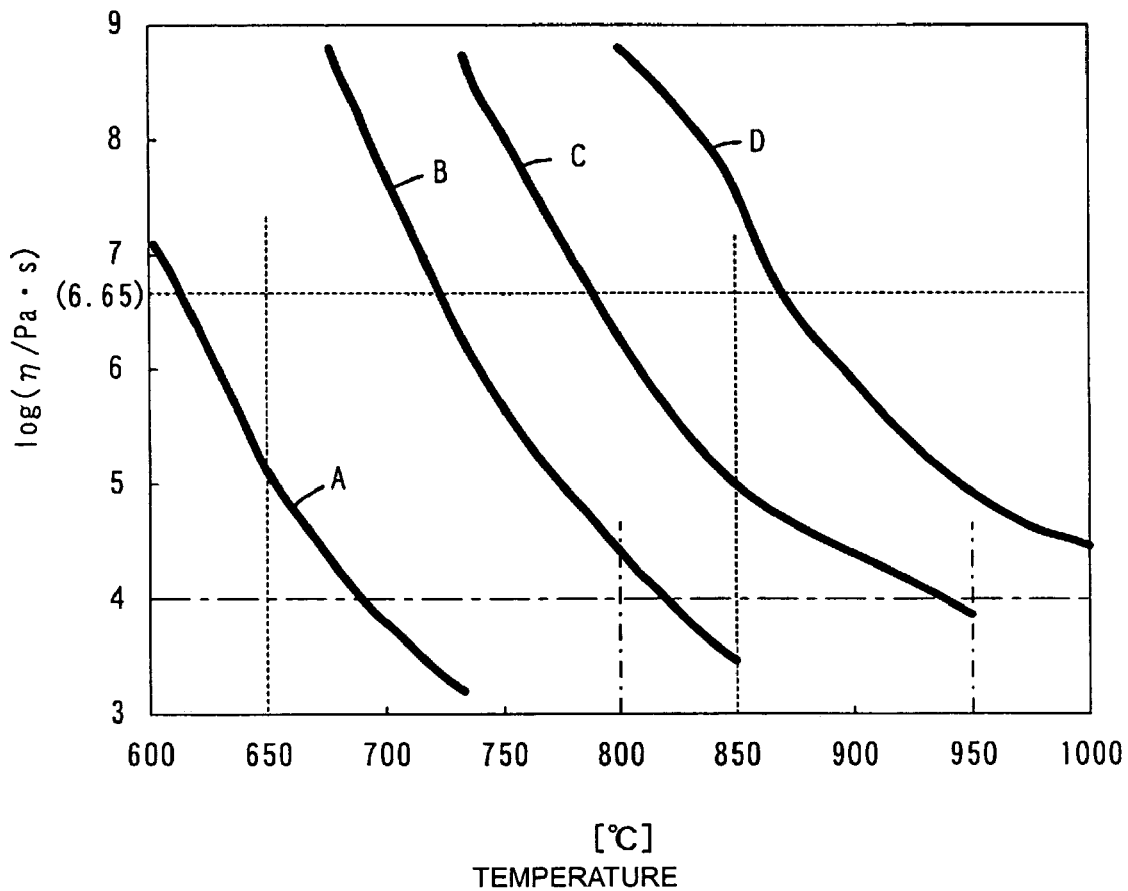
[FIG. 3]

Each glass frit consisting of glass A, B, C, or D exhibiting their respective softening curves shown in FIG. 3 was prepared as the glass frit contained in the electrically conductive paste. Each of the glass A to C was composed of a mixture containing 40 to 55 percent by weight of $SiO_2$, 10 to 20 percent by weight of $B_2O_3$, and 20 to 30 percent by weight of BaO and/or SrO, and the softening curve shown in FIG. 3 was obtained by changing the compositional ratio thereof and the like. The glass D contained 58 percent by weight of $SiO_2$, 29 percent by weight of BaO, and 14 percent by weight of $Al_2O_3$.

As shown in FIG. 3, the glass A had a softening point defined as a temperature at which $\log(\eta/Pa \cdot s)=6.65$ held was 610° C., and a temperature at which $\log(\eta/Pa \cdot s)=4$ held was 690° C. The glass B had a softening point of 720° C., and a temperature at which $\log(\eta/Pa \cdot s)=4$ held was 820° C. The glass C had a softening point of 780° C., and a temperature at which $\log(\eta/Pa \cdot s)=4$ held was 945° C. The glass D had a softening point of 875° C., and a temperature at which $\log(\eta/Pa \cdot s)=4$ held exceeded 1,000° C.

Among these glass A to glass D, only the glass B and the glass C have the softening points within the range of 650° C. to 850° C. and, in addition, the temperatures at which $\log(\eta/Pa \cdot s)=4$ holds are present within the range of 800° C. to 950° C.

2. Electrically Conductive Paste

Each glass frit composed of any one of the above-described glass A to glass D, a copper powder having an average particle diameter of 3 µm and substantially having the shape of a sphere, an organic vehicle in which an acrylic resin was dissolved in terpineol, and if necessary, a polypropylene powder serving as a resin powder that did not dissolved into the solvent component in the organic vehicle and having an average particle diameter of 3 to 7 µm and a copper oxide powder, were used, and an electrically conductive paste was produced in each of the following Examples 1 to 4 and Comparative examples 1 to 5. In the case where an inorganic component was disposed on the particle surfaces of the copper powder serving as the metal powder, alumina was used as the inorganic component, and the amount of coating of alumina in the alumina-coated copper powder was specified to be 1 percent by weight relative to the total weight of the copper powder and alumina.

EXAMPLE 1

An electrically conductive paste composed of 82.0 percent by weight of alumina-coated copper powder, 4.5 percent by weight of glass frit composed of the glass B, and 13.5 percent by weight of organic vehicle was produced.

EXAMPLE 2

An electrically conductive paste composed of 82.0 percent by weight of alumina-coated copper powder, 4.5 percent by weight of glass frit composed of the glass C, and 13.5 percent by weight of organic vehicle was produced.

EXAMPLE 3

An electrically conductive paste composed of 76.0 percent by weight of alumina-coated copper powder, 4.0 percent by weight of glass frit composed of the glass C, 3.0 percent by weight of polypropylene powder, and 17.0 percent by weight of organic vehicle was produced.

EXAMPLE 4

An electrically conductive paste composed of 60.0 percent by weight of alumina-coated copper powder, 4.0 percent by weight of glass frit composed of the glass C, 5.0 percent by weight of polypropylene powder, 14.0 percent by weight of copper oxide powder, and 17.0 percent by weight of organic vehicle was produced.

COMPARATIVE EXAMPLE 1

An electrically conductive paste composed of 82.0 percent by weight of alumina-coated copper powder, 4.5 percent by weight of glass frit composed of the glass A, and 13.5 percent by weight of organic vehicle was produced.

COMPARATIVE EXAMPLE 2

An electrically conductive paste composed of 82.0 percent by weight of alumina-coated copper powder, 4.5 percent by weight of glass frit composed of the glass D, and 13.5 percent by weight of organic vehicle was produced.

COMPARATIVE EXAMPLE 3

An electrically conductive paste composed of 87.5 percent by weight of copper powder not coated with an inorganic component and 12.5 percent by weight of organic vehicle was produced.

COMPARATIVE EXAMPLE 4

An electrically conductive paste composed of 84.9 percent by weight of copper powder not coated with an inorganic component, 2.6 percent by weight of alumina powder, and 12.5 percent by weight of organic vehicle was produced.

COMPARATIVE EXAMPLE 5

An electrically conductive paste composed of 82.0 percent by weight of copper powder not coated with an inorganic component, 4.5 percent by weight of glass frit composed of the glass A, and 13.5 percent by weight of organic vehicle was produced.

3. Multilayer Ceramic Substrate

A multilayer ceramic substrate was produced by using the electrically conductive paste of each of the above-described samples for forming the via hole conductors.

Here, a ceramic material containing barium oxide, silicon oxide, alumina, and boron oxide as primary components and being sinterable at a temperature of 1,000° C. was used for constituting ceramic layers. In the firing step, a sintering temperature of 1,000° C. was applied. In addition, alumina was used as an inorganic material for constituting constraint layers.

4. Evaluation

The presence or absence of occurrence of cracking and the amount of protuberance of the thus produced multilayer ceramic substrate of each sample were evaluated. The results thereof are shown in columns "Crack" and "Amount of protuberance", respectively, in Table 1. With respect to the "Amount of protuberance", an average value of the heights H of the protuberances in the periphery portions (refer to FIG. 4) of the via hole conductor shown in FIG. 2 or FIG. 4 in the multilayer ceramic substrate of each sample was determined.

The via hole conductor targeted for this measurement was produced by laminating 10 layers of sheets, which became 50 μm after firing, and had a length of 0.5 mm in the axis direction after the sintering.

TABLE 1

|  | Crack | Amount of protuberance [μm] |
|---|---|---|
| Example 1 | none | 24.5 |
| Example 2 | none | 7.76 |
| Example 3 | none | −4.92 |
| Example 4 | none | −17.04 |
| Comparative example 1 | none | 43.3 |
| Comparative example 2 | presence | 63.7 |
| Comparative example 3 | presence | 108.5 |
| Comparative example 4 | presence | 55.6 |
| Comparative example 5 | presence | 76.7 |

As shown in Table 1, for Examples 1 to 4 which are within the scope of the present invention, cracking does not occur, and the amounts of protuberance are 30 μm or less, so that small values are exhibited. On the other hand, for Comparative examples 1 to 5 which are out of the scope of the present invention, the amounts of protuberance exceed 30 μm, and cracking occurs in some samples.

In particular, when comparisons are made among Examples 1 to 4, each of the amounts of protuberance in Examples 3 and 4 exhibits a negative value since the polypropylene powder, which is not dissolved into the solvent component in the organic vehicle, is contained in Examples 3 and 4, and the copper oxide powder is further contained in Example 4.

When Example 1 and Comparative example 1 are compared, there is a difference in that the glass frit composed of the glass B is used in Example 1 and the glass frit composed of the glass A is used in Comparative example 1. As a result, in Comparative example 1, the sintering shrinkage of the electrically conductive paste is started at an early stage in the sintering process since the tendency of softening of the glass A used comes toward the low temperature side excessively, the timing does not meet the sintering shrinkage of the ceramic layers, so that the amount of protuberance is increased.

When Example 2 and Comparative example 2 are compared, there is a difference in that the glass frit composed of the glass C is used in Example 2 and the glass frit composed of the glass D is used in Comparative example 2. As a result, in Comparative example 2, the sintering shrinkage of the electrically conductive paste is not exhibited in the sintering process since the tendency of softening of the glass D comes toward the high temperature side excessively, so that the amount of protuberance is also increased thereby.

In Comparative example 3, the amount of protuberance is increased significantly since no material facilitating the suppression of sintering is included in the electrically conductive paste. Furthermore, since no glass frit was added, a material capable of ensuring appropriate joining between the via hole conductor and the ceramic substrate was not included, so that the gaps 5 shown in FIG. 4 occurred.

In Comparative example 4, although not shown in Table 1, unsintered portions were left in a part of the electrically conductive paste. Furthermore, as in Comparative example 3, since a material capable of ensuring appropriate joining between the via hole conductor and the ceramic substrate was not included, the gaps 5 shown in FIG. 4 occurred.

In Comparative example 5, although not shown in Table 1, glass-rich portions were formed on the surface of the sintered body of the electrically conductive paste, so that deposition of the plating film was hindered.

In the above description, the present invention is explained in association with the multilayer ceramic substrate produced by the application of the non-shrinkage process. However, the electrically conductive paste according to the present invention can also be applied to multilayer ceramic substrates produced by manufacturing methods not based on the non-shrinkage process.

The invention claimed is:

1. An electrically conductive paste which can be used for forming wiring conductors and which can be co-fired when firing for sintering ceramic layers in a multilayer ceramic substrate provided with the plurality of laminated ceramic layers with the wiring conductors disposed in association with the ceramic layers, the electrically conductive paste comprising 60 to 85 percent by weight of a metal powder having an inorganic component which is not sintered at a sintering temperature capable of sintering the ceramic layer in the firing and which is an oxide of at least one of Al, Si, Zr, Ni, Ti, Nb, Mn and Mg disposed on particle surfaces of the metal powder, 1 to 10 percent by weight of a glass frit having a softening point 150° C. to 300° C. lower than the sintering temperature, and an organic vehicle, wherein the softening point of the glass frit is 650° C. to 850° C. and the glass frit contains 40 to 55 percent by weight of $SiO_2$, 10 to 20 percent by weight of $B_2O_3$ and 20 to 30 percent by weight of one or both of BaO and SrO.

2. The electrically conductive paste according to claim 1, wherein the glass frit has a viscosity within the range of 800° C. to 950° C. which satisfies $\log(\eta/Pa \cdot s)=4$.

3. The electrically conductive paste according to claim 2, wherein the content of the inorganic component is 0.5 to 8 percent by weight relative to the total weight of the metal powder and the inorganic component.

4. The electrically conductive paste according to claim 3, wherein metal powder has an average particle diameter of 0.5 to 10 μm.

5. The electrically conductive paste according to claim 4, wherein the inorganic component is alumina or zirconia.

6. The electrically conductive paste according to claim 5, wherein the content of the inorganic component is 1 to 7 percent by weight relative to the total weight of the metal powder and the inorganic component.

7. A multilayer ceramic substrate comprising a plurality of laminated ceramic layers and at least one wiring conductor disposed in association with the ceramic layers, wherein the wiring conductor is a sintered body of the electrically conductive paste according to claim 6.

8. The multilayer ceramic substrate according to claim 7, wherein the wiring conductor is via hole conductor disposed penetrating at least one of the ceramic layers.

9. A multilayer ceramic substrate comprising a plurality of laminated ceramic layers and at least one wiring conductor disposed in association with the ceramic layers, wherein the wiring conductor is a sintered body of the electrically conductive paste according to claim 3.

10. The multilayer ceramic substrate according to claim 9, wherein the wiring conductor is via hole conductor disposed penetrating at least one of the ceramic layers.

11. The electrically conductive paste according to claim 1, wherein the content of the inorganic component is 0.5 to 8 percent by weight relative to the total weight of the metal powder and the inorganic component.

12. A multilayer ceramic substrate comprising a plurality of laminated ceramic layers and at least one wiring conductor disposed in association with the ceramic layers, wherein the wiring conductor is a sintered body of the electrically conductive paste according to claim 11.

13. The multilayer ceramic substrate according to claim 12, wherein the wiring conductor is via hole conductor disposed penetrating at least one of the ceramic layers.

14. A multilayer ceramic substrate comprising a plurality of laminated ceramic layers and at least one wiring conductor disposed in association with the ceramic layers, wherein the wiring conductor is a sintered body of the electrically conductive paste according to claim 1.

15. The multilayer ceramic substrate according to claim 14, wherein the wiring conductor is via hole conductor disposed penetrating at least one of the ceramic layers.

16. The electrically conductive paste according to claim 1, wherein metal powder has an average particle diameter of 0.5 to 10 μm.

17. The electrically conductive paste according to claim 1, wherein the inorganic component is alumina or zirconia.

18. The electrically conductive paste according to claim 1, wherein the content of the inorganic component is 1 to 7 percent by weight relative to the total weight of the metal powder and the inorganic component.

\* \* \* \* \*